(12) United States Patent
Zhao et al.

(10) Patent No.: US 7,536,909 B2
(45) Date of Patent: May 26, 2009

(54) THREE-DIMENSIONAL MULTI-CHIPS AND TRI-AXIAL SENSORS AND METHODS OF MANUFACTURING THE SAME

(75) Inventors: Yang Zhao, Andover, MA (US); Feiming Huang, Wuxi (CN); Zongya Li, Wuxi (CN)

(73) Assignee: Memsic, Inc., No. Andover, MA (US)

( * ) Notice: Subject to any disclaimer, the term of this patent is extended or adjusted under 35 U.S.C. 154(b) by 495 days.

(21) Appl. No.: 11/336,336

(22) Filed: Jan. 20, 2006

(65) Prior Publication Data

US 2007/0170228 A1 Jul. 26, 2007

(51) Int. Cl.
*G01P 1/02* (2006.01)
*G01P 15/08* (2006.01)
(52) U.S. Cl. ............................... 73/493; 73/510
(58) Field of Classification Search .................. 73/493, 73/510, 511, 431
See application file for complete search history.

(56) References Cited

U.S. PATENT DOCUMENTS

| | | | | |
|---|---|---|---|---|
| 5,012,316 A | | 4/1991 | Silvermint | ................... 357/26 |
| 6,201,285 B1 * | | 3/2001 | Iwata et al. | ................. 257/419 |
| 6,748,807 B2 * | | 6/2004 | Yoshiuchi et al. | .............. 73/493 |
| 6,841,859 B1 * | | 1/2005 | Thamby et al. | ............. 257/676 |
| 7,030,469 B2 * | | 4/2006 | Mahadevan et al. | ......... 257/659 |
| 7,157,312 B2 * | | 1/2007 | Kim et al. | .................... 438/123 |
| 7,166,911 B2 * | | 1/2007 | Karpman et al. | ............ 257/711 |
| 7,196,404 B2 * | | 3/2007 | Schirmer et al. | ............ 257/676 |
| 7,290,448 B2 * | | 11/2007 | Shirasaka et al. | ............. 73/493 |
| 7,419,853 B2 * | | 9/2008 | Kuhmann et al. | ........... 438/113 |
| 7,424,347 B2 * | | 9/2008 | Babala et al. | .................. 701/1 |
| 2002/0140422 A1 | | 10/2002 | Bodin et al. | ................ 324/247 |
| 2003/0209789 A1 | | 11/2003 | Hanson et al. | .............. 257/678 |

FOREIGN PATENT DOCUMENTS

| | | |
|---|---|---|
| JP | 05291482 | 11/1993 |
| JP | 2004271481 | 9/2004 |
| WO | WO 01/04656 | 1/2001 |
| WO | WO 2005/085891 | 9/2005 |

* cited by examiner

*Primary Examiner*—Helen C. Kwok
(74) *Attorney, Agent, or Firm*—Weingarten, Schurgin, Gagnebin & Lebovici LLP

(57) ABSTRACT

Devices for providing tri-axial measurements in an x-direction, a y-direction, and a z-direction and methods of their manufacture are disclosed. The devices comprise a leadframe, at least one X- and Y-axis sensor die, at least one integrated circuit, and a Z-axis sensor. The Z-axis sensor is encapsulated in a pre-molding before the leadframe, X- and Y-axis sensor die(s), integrated circuit(s), and the pre-molding are encapsulated to provide a final molding.

10 Claims, 9 Drawing Sheets

THREE-DIMENSIONAL MULTI-CHIPS AND TRI-AXIAL SENSORS AND METHODS OF MANUFACTURING THE SAME

CROSS REFERENCE TO RELATED APPLICATIONS (Not applicable)

STATEMENT REGARDING FEDERALLY SPONSORED RESEARCH OR DEVELOPMENT (Not applicable)

BACKGROUND OF THE INVENTION

Field of the Invention

The goal of the manufacture, or packaging, of integrated circuits and other electronic devices, collectively referred to herein as "dies", is to protect the die during fabrication and during use without affecting its ability to perform as it was designed to perform. Typically, dies are packaged using a variety of materials that can include plastics, ceramics, metals, and the like.

With plastic packaging, a die is attached to a leadframe and both are covered with an insulative material or the like. With ceramic and metal packaging, the die is placed in a hermetically sealed environment. The exorbitant cost of metal and, to a lesser extent, ceramic packaging with respect to plastic packaging makes plastic packaging the method of choice for all but a few, unique applications.

Typically, during manufacture, the die or plurality of dies is first attached to a substrate, e.g., a leadframe or another die or chip, and operationally connected to a number of interconnections, e.g., interconnection pads, interconnection bumps or the like. Means of operationally connecting the die or plurality of dies to the substrate can include soldering, wire bonding, flip-chip bonding, tape-automated bonding, and the like.

Traditional soldering and wire-bonding provide a metallurgical bond between a bonding wire, or lead, on the die and an interconnection pad that has been pre-printed or preformed on the surface of the substrate.

Flip-chip bonding also involves attaching a substrate having a plurality of interconnection leads, pads or the like and a die having a plurality of preformed bumps, solder balls or the like. Typically, when mounting the die, the die is inverted, or "flipped" so that the leads are between the die and the substrate. Once the preformed bumps or solder balls of the die are aligned with the interconnection leads of the substrate, the preformed solder bumps are re-heated, e.g., by solder reflow, above the melting point of the solder to effect the assembly, or surface mounting, of the die and the substrate. Ultrasonic and adhesive bonding can also be used.

Tape-automated bonding (TAB) involves interposing a TAB assembly, comprising a metal foil on which a lead pattern is etched, between a substrate and a die. Typically, the lead pattern can be intricate and/or include a multiplicity of input/output interconnections. The TAB assembly can further include, e.g., adhesives, polymeric material, and interconnection bumps. Once the TAB assembly has been interposed and the die and substrate have been properly aligned, the TAB assembly is bonded to the die and the substrate, e.g., by ultrasonic bonding.

To date, three-dimensional ("3D") packaging has followed trends and developments of two-dimensional ("2D") packaging. More specifically, the 3D approach has been to increase density by merely layering or stacking 2D packages and, in some applications, to stack elements or dies on edge. The elements associated with this latter application include each of the dies, the interconnections between dies, attachments between dies, and the leads.

Although 3D packaging offers advantages in package density, system power, and electrical performance, the disadvantages include poor yields, thermal dissipation shortcomings, and cross-talk. Therefore, it is desirable to provide novel packaging for three-dimensional devices, e.g., sensors and the like, and to provide methods of manufacturing the same.

BRIEF SUMMARY OF THE INVENTION

In accordance with the present invention, devices are disclosed for providing tri-axial measurements in an x-direction, a y-direction, and a z-direction and methods of their manufacture. The devices comprise a leadframe, one or more X- and Y-axis sensor dies, an integrated circuit, and a Z-axis sensor. In one embodiment, the leadframe, X- and Y-axis sensor dies, integrated circuit, and the Z-axis sensor die are encapsulated in a plastic material to provide a final molding.

In still another aspect of this embodiment, the leadframe includes a preformed vertical or substantially vertical paddle to which the Z-axis sensor die is in physical and/or operational communication.

In one aspect of this embodiment, the leadframe includes a sub-paddle and a plurality of leadframe legs and, further, the Z-axis sensor die is attached to the sub-paddle and the plurality of leadframe legs so that the sensing direction of the Z-axis sensor die is orthogonal or substantially orthogonal to the sensing directions of the X- and Y-axis sensor dies.

In still another aspect of this embodiment, initially, the sensing direction of the Z-axis sensor die with respect to the leadframe legs is in or substantially in the same plane as the legs; however, the leadframe legs can be reconfigured, e.g., bent or rotated, so that the re-configured portions of the leadframe legs and the Z-axis sensor die are orthogonal or substantially orthogonal to the sensing directions of the X- and Y-axis sensor dies.

In yet another aspect of this embodiment, the Z-axis sensor die, a portion of the leadframe, and a portion of the input/output pads are encapsulated to provide a pre-molding that is then encapsulated in the final molding. Alternatively, the X- and Y-axis sensor dies, a portion of the leadframe, the integrated circuit, and a portion of the input/output pads are encapsulated to provide a pre-molding that is then encapsulated in the final molding.

Methods of manufacturing these devices comprise providing a leadframe, a plurality of input/output leads, and a plurality of Z-axis sensor leads; attaching one or more X- and Y-axis sensor dies and one or more integrated circuits to the leadframe and the leads; attaching a Z-axis sensor die to the leadframe and the Z-axis sensor leads so that the sensing direction is orthogonal or substantially orthogonal to sensing directions of the X- and Y-axis sensor dies; and encapsulating the leadframe, the input/output leads, the Z-axis sensor leads, the X- and Y-axis sensor dies, the integrated circuits, and the Z-axis sensor die in a final molding.

In one aspect of the embodied method, the step of attaching the Z-axis sensor includes, further, attaching the Z-axis sensor die to the input/output leads and to the Z-axis sensor leads so that its sensing direction is in the same or substantially the same plane as the sensing directions of the X- and Y-axis sensor dies. For example, the Z-axis sensor die, a portion of the input/output leads, and a portion of the Z-axis sensor lead are pre-encapsulated and the pre-encapsulated Z-axis sensor die can be re-configured so that the sensing direction is orthogonal or substantially orthogonal to the sensing directions of the X- and Y-axis sensor dies.

In another embodiment, the devices for providing tri-axial measurements comprise a base substrate having an inner cavity, one or more X- and Y-axis sensor dies, and Z daughter board bonding with a Z-axis sensor die. In one aspect of this embodiment, a slotted portion is provided in each side wall of a pair of opposing side walls in the inner cavity for mounting the Z-axis sensor die vertically. In another aspect of this embodiment, the slotted portion includes a plurality of input/output pads and a plurality of interconnection pads that are structured and arranged in the bottom portion of the inner cavity.

The methods of manufacturing the devices comprise providing a base substrate having a cavity portion; attaching one or more X- and Y-axis sensor dies to the base; and attaching a Z-axis sensor die to the base substrate so that the sensing direction is orthogonal or substantially orthogonal to sensing directions of the X- and Y-axis sensor dies. In one aspect of the embodied method, the step of attaching the Z-axis sensor die includes bonding the Z-axis sensor to the daughter board; providing a slotted portion in opposing side walls of the cavity; and installing the Z-axis daughter board, with the sensor die attached, into the slotted portion so that the sensing direction of the Z-axis sensor die is orthogonal or substantially orthogonal to the sensing directions of the X- and Y-axis sensor dies.

In another embodiment, the devices for providing tri-axial measurements comprise a base substrate having an inner cavity, one or more X- and Y-axis sensor dies, and a Z-axis sensor die. In one aspect of this embodiment, a plurality of input/output pads and a plurality of interconnection pads that are structured and arranged in the side wall of the sub-cavity are provided.

The methods of manufacturing the devices comprise providing a base substrate having a cavity portion; attaching one or more X- and Y-axis sensor dies to the base substrate; and attaching a Z-axis sensor die to a side wall, e.g., by soldering, so that the sensing direction is orthogonal or substantially orthogonal to sensing directions of the X- and Y-axis sensor dies.

In yet another embodiment, the devices for providing tri-axial measurements comprise a flexible carrier, one or more X- and Y-axis sensor dies, one or more integrated circuits, a Z-axis sensor die, and a more rigid, L-type substrate. In one aspect of this embodiment, the Z-axis sensor die is disposed on a distal end portion of the flexible carrier and the distal end portion is bent or rotated about 90 degrees with respect to the horizontal, so that the distal end portion is oriented orthogonal or substantially orthogonal to the flexible carrier. In another aspect of this embodiment, the device further comprises a final molding that encapsulates the flexible carrier, the X- and Y-axis sensor dies, the one or more integrated circuits, the z-axis sensor, and the rigid substrate.

The method of manufacturing this device comprises structuring and arranging a Z-axis sensor die, X- and Y-axis sensor dies, and integrated circuits to a flexible carrier; reconfiguring that portion of the flexible carrier having the Z-axis sensor die so that it is vertical or substantially vertical with respect to the flexible carrier and, further, so that the sensing direction of the Z-axis sensor die is orthogonal or substantially orthogonal to sensing directions of the X- and Y-axis sensor dies; structuring and arranging the flexible carrier to a more rigid, L-type substrate; and encapsulating the substrate, the flexible carrier, the X- and Y-axis sensor dies, the integrated circuits, and the Z-axis sensor die in a molding.

In yet another embodiment, the devices for providing tri-axial measurements comprise a base substrate, one or more X- and Y-axis sensor dies; one or more integrated circuits; a cube carrier; and one or more Z-axis sensor dies. The method of its manufacture comprises attaching the a cube carrier to the base substrate; attaching the X- and Y-axis sensor dies to the base substrate; attaching the integrated circuits to the base substrate; attaching the Z-axis sensor dies to one or more of the vertical faces of the cube carrier; and encapsulating the base substrate, the cube carrier, the X- and Y-axis dies, the integrated circuits, and the Z-axis sensor dies in a molding.

BRIEF DESCRIPTION OF THE SEVERAL VIEWS OF THE DRAWINGS

The invention will be more fully understood by referring to the Detailed Description of the Invention in conjunction with the Drawings, of which.

DETAILED DESCRIPTION OF THE INVENTION

Disclosed are three-dimensional (3D) multi-chips and methods of their manufacture, or "packaging". In describing the various embodiments of the devices, methods of their manufacture will be described concurrently. Furthermore, although the 3D multi-chips will be described in terms of a 3D multi-chip for use as a tri-axial sensor, the invention is not to be construed as being limited thereto.

Figure 1A:
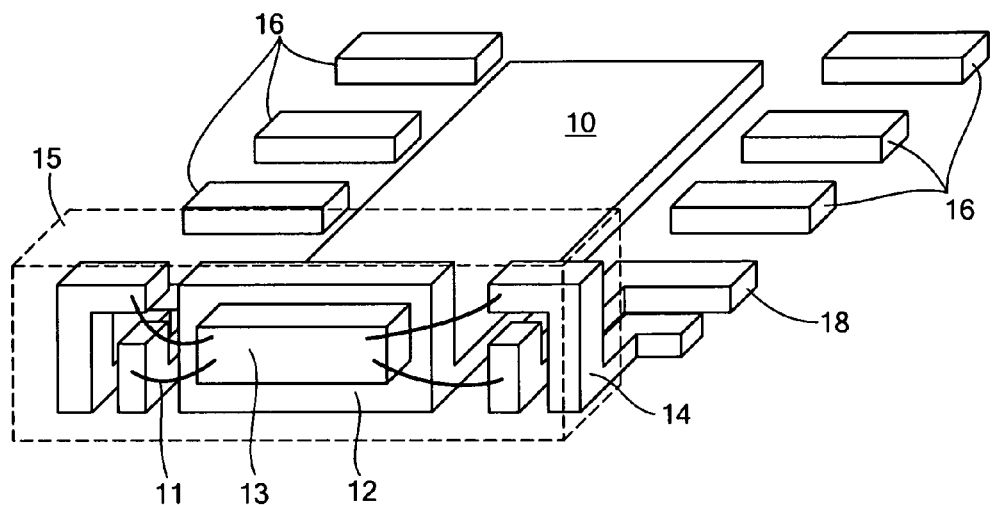
FIGS. 1A and 1B provide an illustrative example of a three-dimensional multi-chip and/or tri-axial sensor in two stages of manufacture in accordance with a first embodiment of the present invention.
Figure 1B:
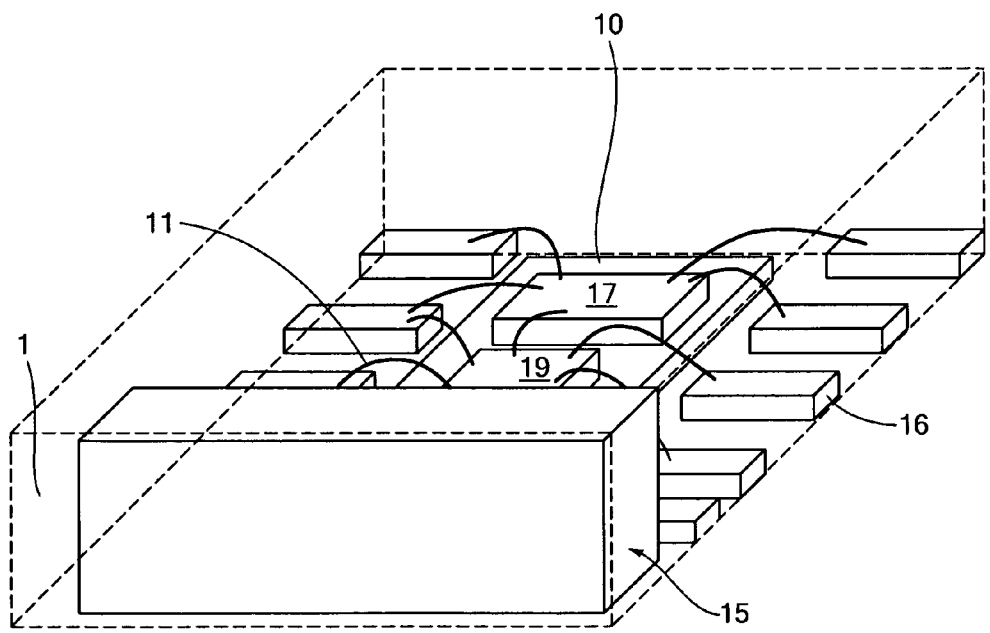

Referring to FIGS. 1A and 1B there is shown a first embodiment of the present invention in two stages of manufacture. Shown is a substrate, a carrier or a leadframe 10 having a preformed vertical portion, or paddle 12. Although the vertical paddle 12 shown is orthogonal or substantially orthogonal to the leadframe 10, the invention is not to be construed as being limited to a perfectly vertical paddle 12 that forms a right angle with the leadframe 10. Indeed, the invention can also be practiced with the paddle 12 forming an acute angle, and obtuse angle, and/or an angle that deviates slightly from perfectly vertical with the leadframe 10.

A plurality of input/output (I/O) interconnections, or pads 16 is structured and arranged in the same or substantially the same plane and along the axis of the leadframe 10 in a manner well known to those of ordinary skill in the art. In one aspect of the present embodiment, preformed leads to the Z-axis sensor die 14 and 18 are structured and arranged in proximity of and on either side of the vertical paddle 12. In another aspect of the present embodiment, some portion of the preformed leads 14 and 18 also is in or substantially in the same plane as the leadframe 10 and the I/O pads 16. The invention is not to be construed as being limited to just four preformed leads 14 and 18. Indeed, the invention can also be practiced with fewer or more leadframe legs.

In one aspect of the first embodiment, the Z-axis sensor die 13 is fixedly and operatively attached, e.g., by soldering, by adhesives, by wire-bonding, by flip-chip bonding, and the like, to the vertical paddle 12 of the leadframe 10. Bonding wires, or leads, 11 provide operational communication between the Z-axis sensor die 13 and the preformed leads 14 and 18. The leads 11, the vertical paddle 12, the Z-axis sensor die 13, and some portion of the preformed leads 14 and 18 are encapsulated in a pre-molding 15 in any manner that is known to those of ordinary skill in the art. The encapsulating material for the pre-molding can include as examples and without limitation, plastics, polymers, polyamides, epoxies, and the like.

Once the vertical paddle 12 and the Z-axis sensor die 13 are encapsulated in the pre-molding 15, one or more X- and Y-axis sensor dies 17 and an integrated circuit 19, e.g., typically, an application-specific integrated circuit (ASIC), can be fixedly and operationally attached, e.g., by soldering, by adhesives, by flip-chip bonding, by wire-bonding, and the like, to the leadframe 10. Leads or wires 11 provide operational communication between the X- and Y-axis sensor die(s) 17 and the ASIC 19, between the X- and Y-axis sensor die(s) 17 and the I/O pads 16, between the ASIC 19 and the preformed leads 14 and 18, and between the ASIC 19 and the I/O pads 16. Once all of the leads 11 have been properly connected, the leadframe 10, the ASIC 19, the I/O pads 16, the X- and Y-axis sensor die(s) 17, and the pre-molding 15 can be encapsulated in a final molding 1 in any manner that is known to those of ordinary skill in the art. The encapsulating material for the pre-molding can include as examples and without limitation, plastics, polymers, polyamides, epoxies, and the like.

The final molding 1 can then be trimmed and formed as necessary. Electroplating and other processes can also be performed on the exposed portions of the I/O pads 16 and the preformed leads 14 and 18.

Figure 2A:
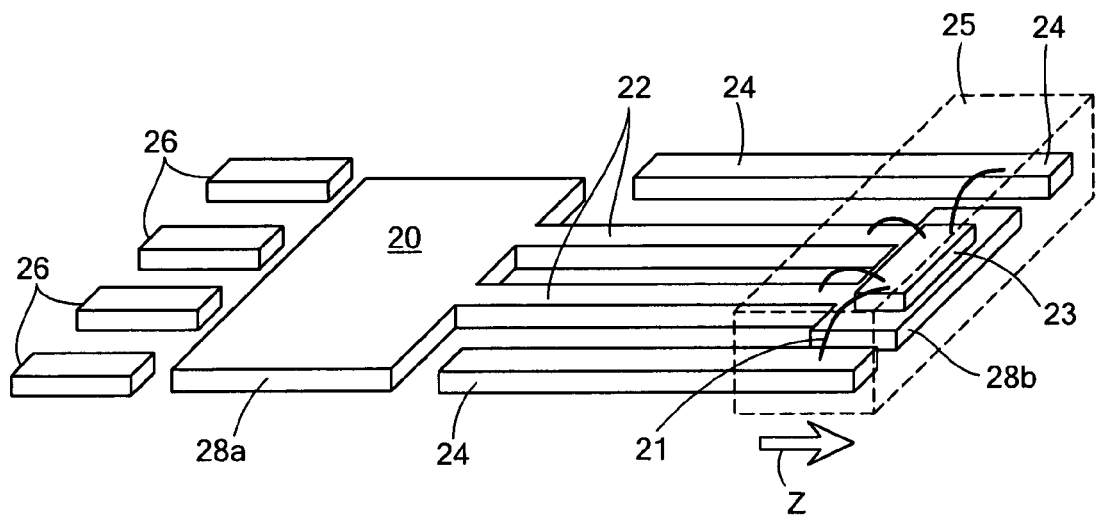
FIGS. 2A and 2B provide an illustrative example of a three-dimensional multi-chip and/or tri-axial sensor in two stages of manufacture in accordance with a second embodiment of the present invention.
Figure 2B:
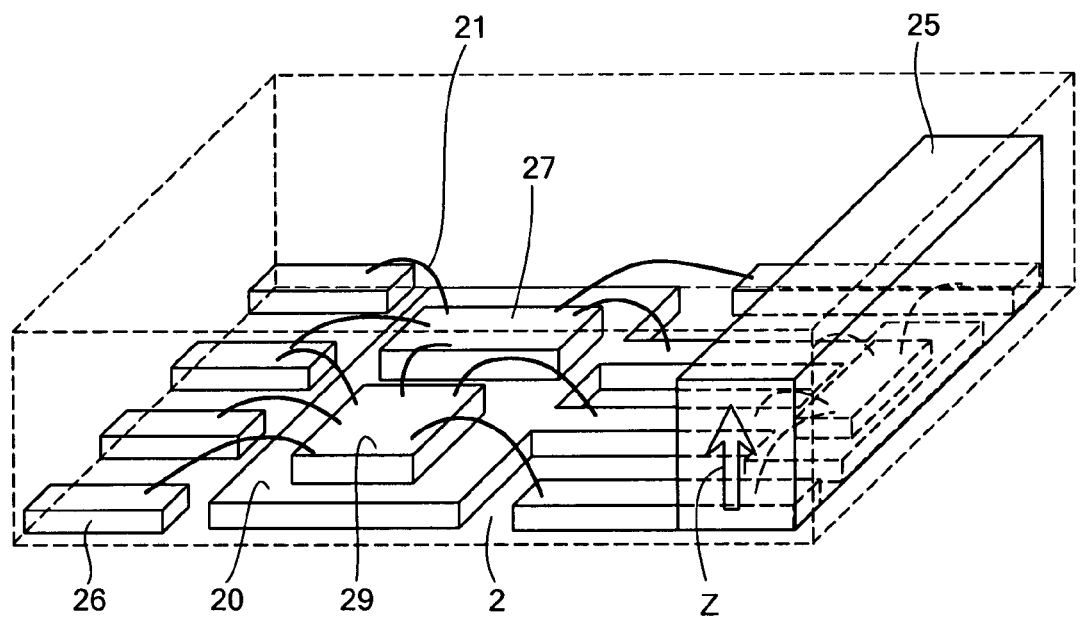

Referring to FIGS. 2A and 2B, there is shown a second embodiment of the present invention in two stages of manufacture. Shown is a substrate, carrier or leadframe 20 comprising a plurality of leadframe legs 22 that interconnect a main leadframe island 28a to a leadframe sub-island 28b. Although two leadframe legs 22 are shown interconnecting the main leadframe island 28a to the leadframe sub-island 28b, the invention is not to be construed as being limited to just two leadframe legs 22. Indeed, the invention can also be practiced with one or more leadframe legs 22.

A plurality of I/O interconnections or pads 26 is structured and arranged in the same or substantially the same plane and along the x- or y-axis of the main leadframe island 28a in a manner well known to those of ordinary skill in the art. The Z-axis sensor die leads 24 are structured and arranged in the same or substantially the same plane of the leadframe legs 22. The invention is not to be construed as being limited to just two Z-axis sensor die leads 24. Indeed, the invention can also be practiced with fewer or more Z-axis sensor die leads 24.

In one aspect of the second embodiment, the Z-axis sensor die 23 is fixedly and operationally attached, e.g., by soldering, by adhesives, by wire-bonding, by flip-chip bonding, and the like, to the leadframe sub-portion 28b of the leadframe 20. Although FIGS. 2A and 2B show the Z-axis sensor 23 disposed on the top, or upper side, of the leadframe sub-island 28b, the Z-axis sensor 23, alternatively, could be disposed on the bottom, or under side, of the leadframe sub-island 28b. In one aspect of this embodiment, the Z-axis sensor die 23 is attached to the leadframe sub-island 28b so that the initial sensing direction Z is in the same direction as the x- or y-axis of the leadframe legs 22 and the Z-axis sensor die leads 24 as shown by the arrow in FIG. 2A. Bonding wires, or leads, 21 provide operational communication between the Z-axis sensor die 23, the Z-axis sensor die leads 24, and each of the leadframe legs 22.

In another aspect of the second embodiment, the leads 21, the Z-axis sensor die 23, some portion of the Z-axis sensor die leads 24, and some portion of the leadframe legs 22 are encapsulated in a pre-molding 25 in any manner that is known to those of ordinary skill in the art. The encapsulating material for the pre-molding can include as examples and without limitation, plastics, polymers, polyamides, epoxies, and the like.

Once the Z-axis sensor die 23 is encapsulated, the sensing direction Z of the Z-axis sensor die 23 can be made orthogonal or substantially orthogonal to the plane of the leadframe 20, preferably, by re-configuring the pre-molding 25. More specifically, the sensing direction Z of the Z-axis sensor die 23 can be made orthogonal or substantially orthogonal to the plane of the leadframe 20 by rotating or bending the pre-molding 25 approximately 90 degrees from the horizontal so that the pre-molding 25 itself is orthogonal or substantially orthogonal to the plane of the leadframe 20.

After the pre-molding 25 has been re-configured, one or more X- and Y-axis sensor dies 27 and an ASIC 29 can be fixedly and operationally attached, e.g., by soldering, by adhesives, by wire-bonding, by flip-chip bonding, and the like, to the leadframe 20. Leads 21 provide operational communication between the X- and Y-axis sensor die(s) 27 and the ASIC 29, between the X- and Y-axis sensor die(s) 27 and the I/O pads 26, between the ASIC 29 and the encapsulated Z-axis sensor die 23, and between the X- and Y-axis sensor die(s) 27 and the encapsulated Z-axis sensor die 23. Once all of the leads 21 have been connected, the leadframe 20, the ASIC 29, the I/O pads 26, the X- and Y-axis sensor die(s) 27, and the pre-molding 25 can be encapsulated in a final molding 2 in any manner that is known to those of ordinary skill in the art.

The encapsulating material for the pre-molding can include as examples and without limitation, plastics, polymers, polyamides, epoxies, and the like. The final molding 2 can then be trimmed and formed as necessary. Electroplating and other processes can also be performed on the exposed portions of the I/O pads 26, some portion of the Z-axis sensor die leads 24, and some portion of the leadframe legs 22.

Figure 3A:
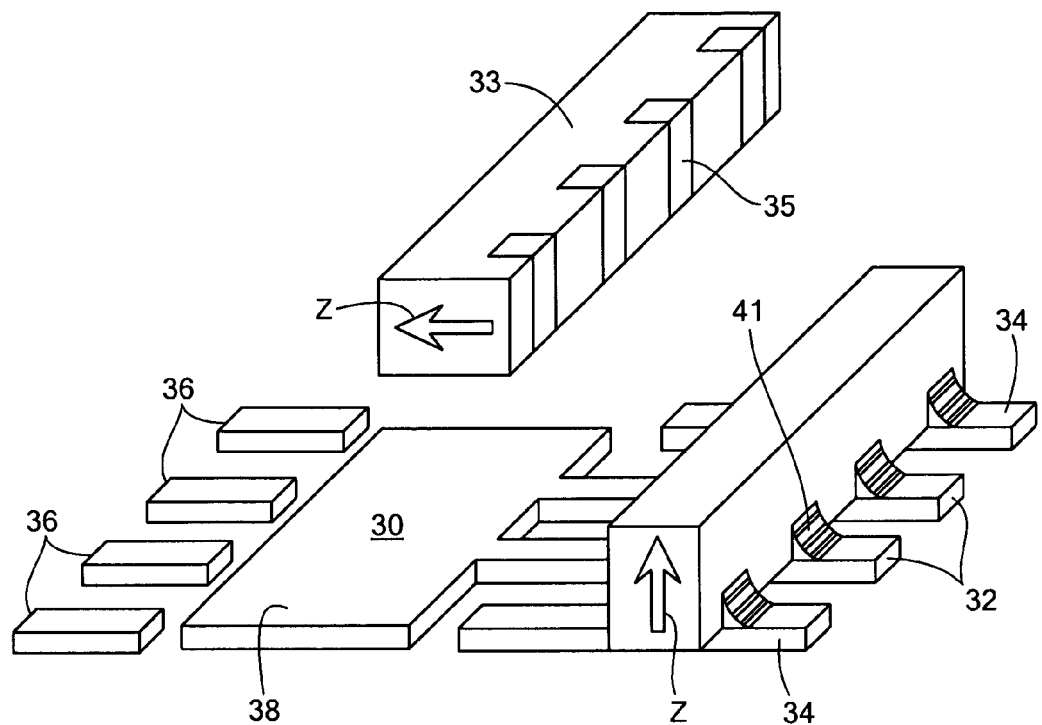
FIGS. 3A and 3B provide an illustrative example of a three-dimensional multi-chip and/or tri-axial sensor in two stages of manufacture in accordance with a third embodiment of the present invention.
Figure 3B:
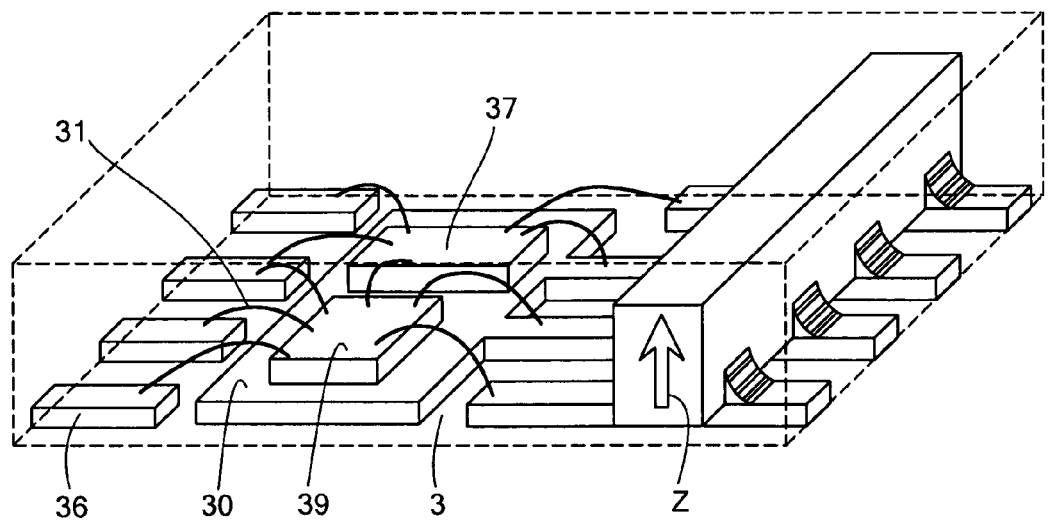

Referring to FIGS. 3A and 3B, there is shown a third embodiment of the present invention in two stages of manufacture. Shown is a substrate, a carrier or a leadframe 30 comprising a main leadframe island 38 and a plurality of leadframe legs 32 connected thereto. Although only two leadframe legs 32 are shown connected to the main leadframe island 38, that the invention is not to be construed as being limited to just two leadframe legs 32. Indeed, the invention can also be practiced with one or more leadframe legs 32.

A plurality of I/O interconnections or pads 36 is structured and arranged in the same or substantially the same plane and about the x- or y-axis of the main leadframe island 38 in a manner well known to those of ordinary skill in the art. The Z-axis sensor leads 34 are also structured and arranged in the same or substantially the same plane of the leadframe legs 32. The invention is not to be construed as being limited to just two Z-axis sensor die leads 34. Indeed, the invention can also be practiced with fewer or more Z-axis sensor die leads 34.

In one aspect of the third embodiment, the Z-axis sensor 33 can be a pre-packaged independent component or a pre-packaged silicon chip. The pre-packaged Z-axis sensor 33 comprises a plurality of I/O pads 35, e.g., external pins, leadless leads, bumping pads, and the like. The plurality of I/O pads 35 is structured and arranged on one or more sides of the Z-axis sensor 33. The location of I/O pads 35 on the Z-axis sensor 33 should align with the leadframe legs 32 and the Z-axis sensor leads 34, e.g., four to four as shown in FIG. 3A.

In another aspect of the present embodiment, the Z-axis sensor 33 is fixedly and operationally attached, e.g., by soldering, by adhesives, by flip-chip bonding, by solder reflow, and the like, to the leadframe legs 32 and to the Z-axis sensor preformed leads 34. Because the Z-axis sensor 33 comes with its own I/O pads 35, bonding wires are not necessary to connect the Z-axis sensor 33 to the other components.

For illustrative purposes only, solder joints 41 are shown in FIGS. 3A and 3B. If the I/O pads 35 are structured and arranged on two sides of the Z-axis sensor 33 as shown in FIG. 3A, the solder joint 41 covers the exposed portion of the I/O pad 35.

In another aspect of the third embodiment, prior to attaching the Z-axis sensor 33, each of the leadframe legs 32 and each of the Z-axis sensor leads 34 are arranged to be in registration with a discrete I/O pad 35. As shown in FIG. 3A, the Z-axis sensor 33 is fixedly and operationally attached to the leadframe legs 32 and to the Z-axis sensor leads 34 so that the sensing direction Z is orthogonal or substantially orthogonal to the plane of the leadframe 30.

After the pre-packaged Z-axis sensor 33 has been attached to the leadframe legs 32 and to the Z-axis sensor leads 34, one or more X- and Y-axis sensor dies 37 and an ASIC 39 can be fixedly and operationally attached, e.g., by soldering, by adhesives, by wire-bonding, by flip-chip bonding, and the like, to the leadframe 30. Leads 31 provide operational communication between the X- and Y-axis sensor die(s) 37 and the ASIC 39, between the X- and Y-axis sensor die(s) 37 and the I/O pads 36, between the ASIC 39 and the Z-axis sensor 33, and between the X- and Y-axis sensor die(s) 37 and the Z-axis sensor 33.

Once all of the leads 31 have been connected, the leads 31, the ASIC 39, the leadframe 30, the I/O pads 36, the X- and Y-axis sensor die(s) 37, and the Z-axis sensor 33 can be encapsulated in a final molding 3 in any manner that is known to those of ordinary skill in the art. The encapsulating material for the final molding can include as examples and without limitation, plastics, polymers, polyamides, epoxies, and the like. The final molding 3 can then be trimmed and formed as necessary. Electroplating and other processes can also be performed on the exposed portions of the I/O pads 36, the leadframe legs 32, and the Z-axis sensor leads 34.

Figure 4A:
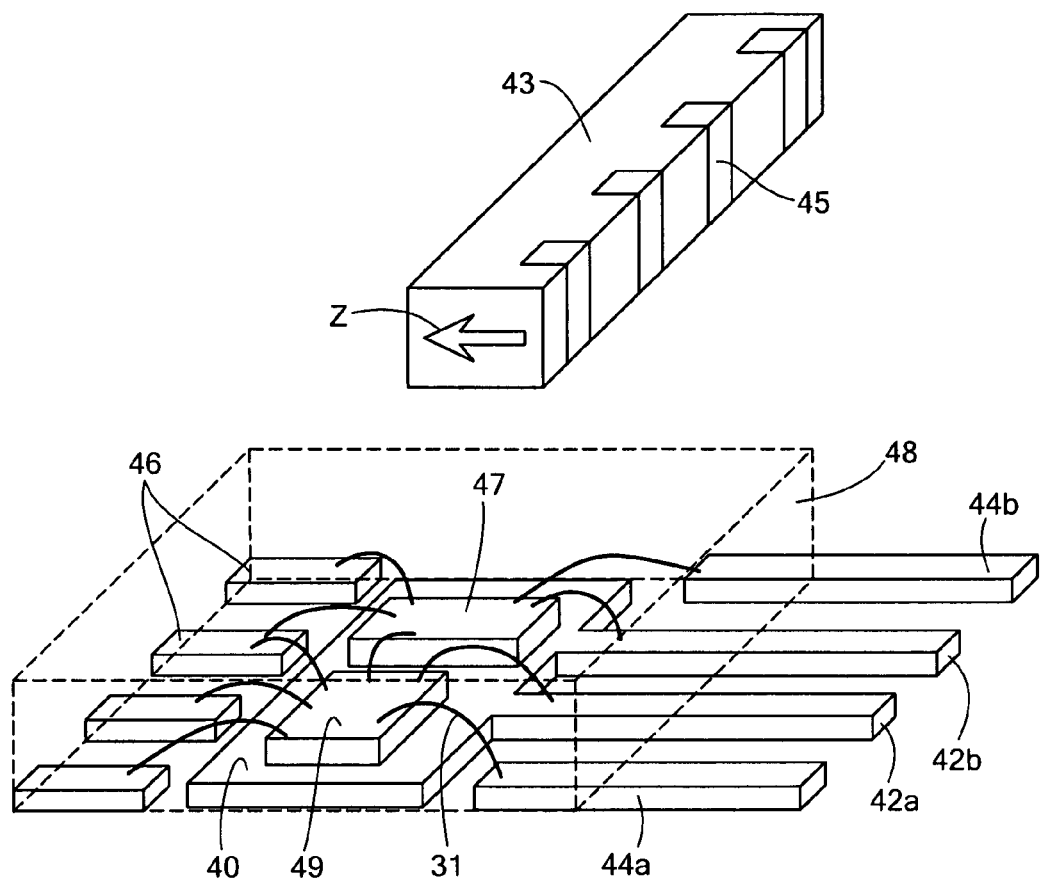
FIGS. 4A and 4B provide an illustrative example of a three-dimensional multi-chip and/or tri-axial sensor in two stages of manufacture in accordance with a fourth embodiment of the present invention.
Figure 4B:
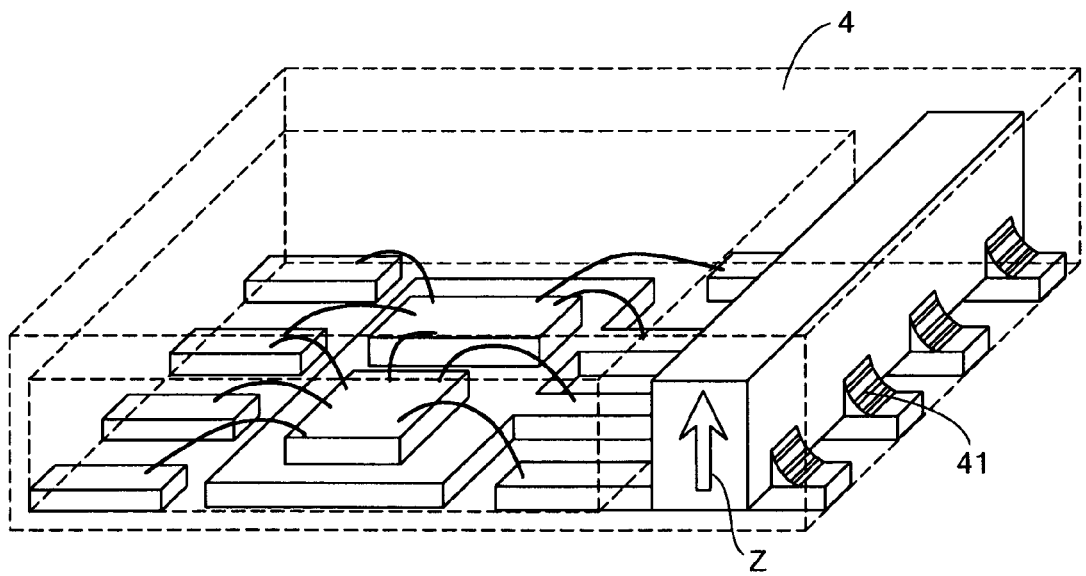

Alternatively, in a fourth embodiment, the manufacturing sequence can be modified slightly as depicted in FIGS. 4A and 4B. More particularly, the one or more X- and Y-axis sensor dies 47 and an ASIC 49 can be fixedly and operationally attached, e.g., by soldering, by adhesives, by wire-bonding, by flip-chip bonding, and the like, to the leadframe 40. Furthermore, leads 31 provide operational communication between the X- and Y-axis sensor die(s) 47 and the ASIC 49, between the X- and Y-axis sensor die(s) 47 and the I/O pads 46, between the ASIC 49, a first lead leg 42a, and a first Z-axis sensor lead 44a, and between the X- and Y-axis sensor die(s) 47, a second lead leg 42b, and a second Z-axis sensor lead 44b.

Once all of the leads 31 have been connected and the lead legs 42a and 42b and Z-axis sensor leads 44a and 44b have been arrayed to be in registration with a plurality of I/O pads 45 on the Z-axis sensor 43, the ASIC 49, the leadframe 40, the I/O pads 46, the X- and Y-axis sensor die(s) 47, and portions of the lead legs 42a and 42b and the Z-axis sensor leads 44a and 44b can be encapsulated in a pre-molding 48 in any manner that is known to those of ordinary skill in the art. The encapsulating material for the pre-molding can include as examples and without limitation, plastics, polymers, polyamides, epoxies, and the like.

As with the third embodiment, the Z-axis sensor 43 can be a pre-packaged independent component or a pre-packaged silicon chip. The Z-axis sensor 43 comprises a plurality of I/O pads 45, e.g., external pins, leadless leads, bumping pads, and the like. More preferably, the plurality of I/O pads 45 is structured and arranged on one or more sides of the Z-axis sensor 43. The location of I/O pads 45 on the Z-axis sensor 43 should align with leadframe legs 42a and 42b and Z-axis sensor leads 44a and 44b, e.g., four to four as shown in FIG. 4A.

The Z-axis sensor 43 is fixedly attached, e.g., by soldering, by adhesives, by flip-chip bonding, and the like, to the leadframe legs 42a and 42b and the Z-axis sensor leads 44a and 44b. For illustrative purposes only, solder joints 41 are shown in FIG. 4B. If the plurality of I/O pads 45 are structured and arranged on two sides of the Z-axis sensor 43 as shown in FIG. 4A, the solder joint 41 covers the exposed portion of the I/O pad 45.

In one aspect of the fourth embodiment, the Z-axis sensor 43 is fixedly and operationally attached to the leadframe legs 42a and 42b and to the Z-axis sensor leads 44a and 44b so that the sensing direction Z is orthogonal or substantially orthogonal to the plane of the leadframe 40. Because the pre-packaged Z-axis sensor 43 comes with its own I/O pads 45, bonding wires are not necessary to connect the Z-axis sensor 43 to the leadframe legs 42a and 42b or to the Z-axis sensor leads 44a and 44b.

Once the Z-axis sensor 43 is fixedly attached, the pre-molding 48, the exposed portions of the leadframe legs 42a and 42b, the Z-axis sensor leads 44a and 44b, and the Z-axis sensor 43 can be encapsulated in a final molding 4 in any manner that is known to those of ordinary skill in the art. The encapsulating material for the final molding can include as examples and without limitation, plastics, polymers, polyamides, epoxies, and the like. The final molding 4 can then be trimmed and formed as necessary. Electroplating and other processes can also be performed on the exposed portions of the I/O pads 46.

Figure 5A:
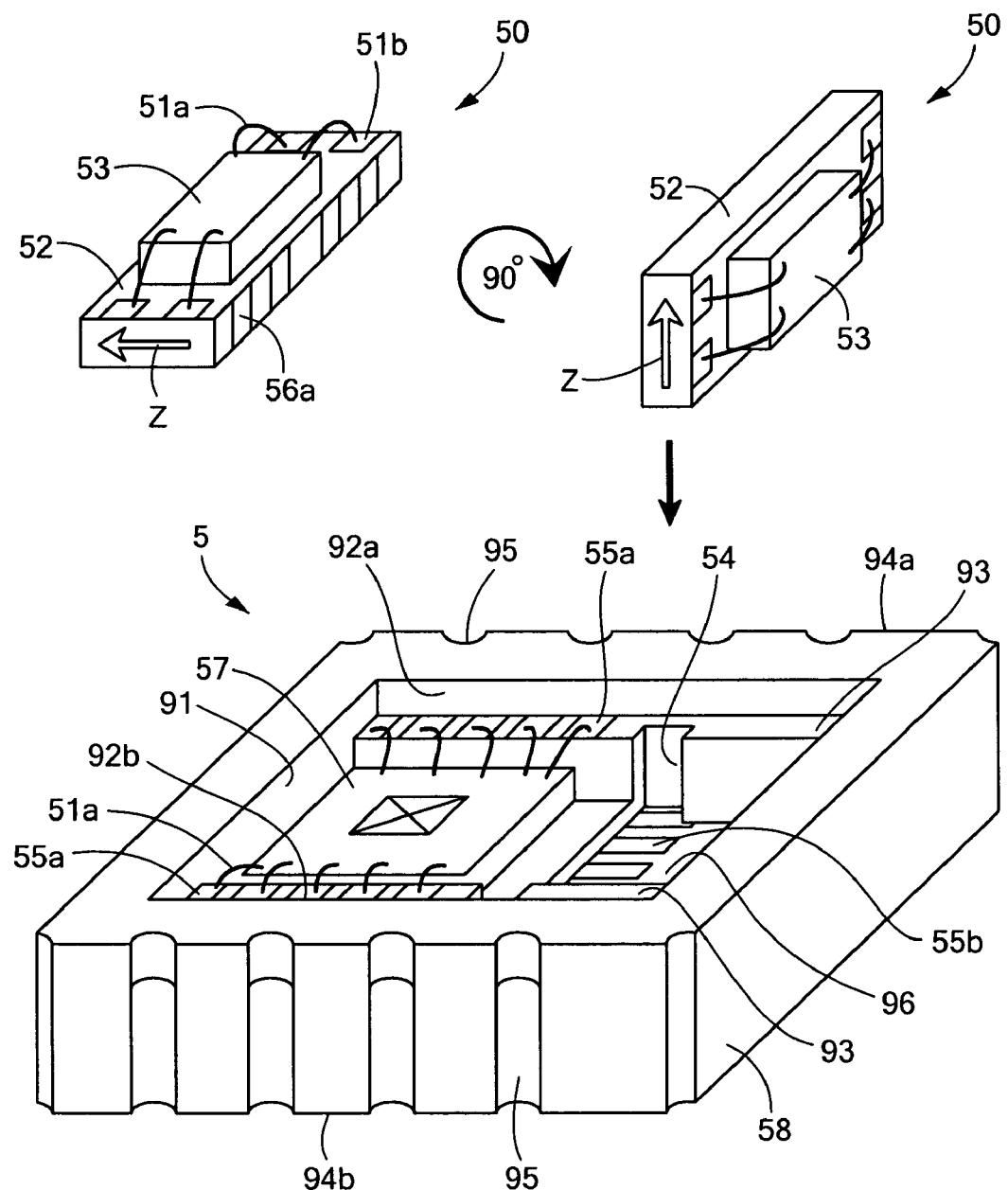
FIGS. 5A and 5B provide an illustrative example of a three-dimensional multi-chip and/or tri-axial sensor in two stages of manufacture in accordance with a fifth embodiment of the present invention.
Figure 5B:
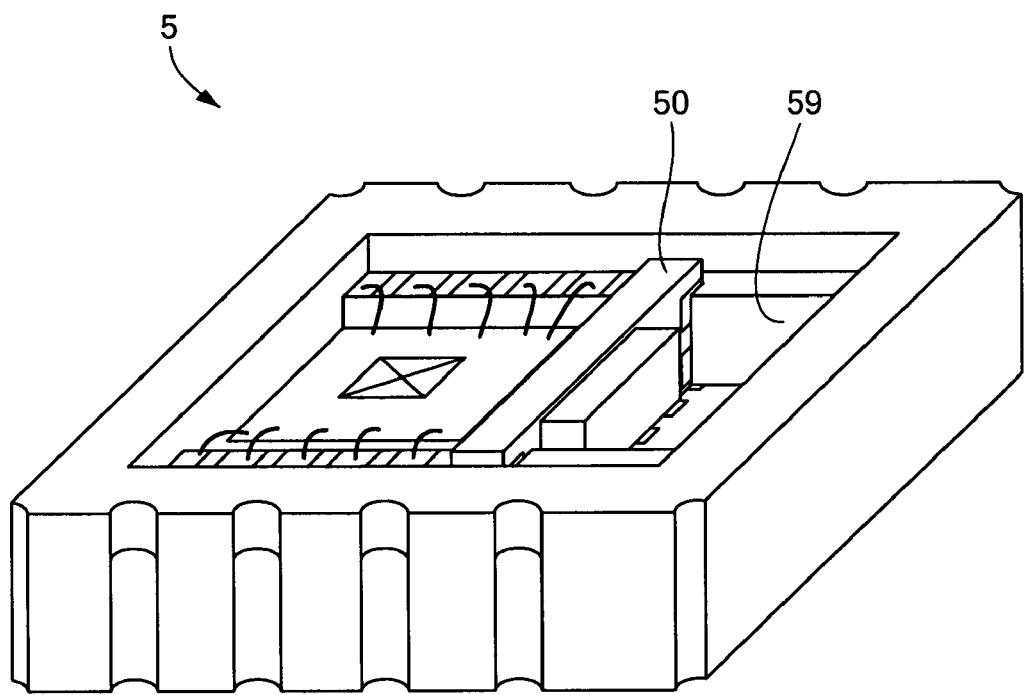

Whereas embodiments one through four disclose a flat or substantially flat leadframe and one or two stages of encapsulation, the fifth and sixth embodiments disclose installing a Z-axis sensor in a cavity in a preformed package. Referring to FIGS. 5A and 5B, there is shown a fifth embodiment of the present invention in two stages of manufacture. Shown is a preformed base substrate, or package, 58, e.g., a ceramic package, pre-molding plastic cavity package or a package of some other rigid material, e.g., metal, alloy, and the like. During manufacture, the base substrate 58 has been hollowed out and/or pre-molded to include a cavity 91. Moreover, during manufacture, the base substrate 58 has been preformed or machined to include a plurality of external I/O interconnections or pads 95, which have been disposed on two or more of the exterior side walls 94a and 94b.

The cavity 91 includes a pair of opposing side walls 92a and 92b, each side wall 92a and 92b having a shelf portion 93 that houses a plurality of internal interconnection pads 55a, and that, further, includes a slotted portion 54. The slotted portions 54 on each of the pair of opposing side walls 92a and 92b are in registration with each other. A plurality of internal interconnection pads 55b is provided at the cavity bottom 96 between the opposing slotted portions 54.

In one aspect of the fifth embodiment, one or more X- and Y-axis sensor dies 57 is fixedly and operationally attached, e.g., by soldering, by adhesives, by wire-bonding, by flip-chip bonding, and the like, to the cavity bottom 96 between the shelf portions 93 and the plurality of interconnection pads 55a. Bonding wires, or leads, 51a provide operational communication between the X- and Y-axis sensor die(s) 57 and the interconnection pads 55a.

Those skilled in the art can appreciate that the integrated circuit (not shown) can be integrally designed with the X- and Y-axis sensor dies 57 or stacked above or below the X- and Y-axis sensor dies 57 or disposed on the same plane as the X- and Y-axis sensor dies 57.

In another aspect of the fifth embodiment, a Z-axis sensor die 53 is fixedly and operationally attached, e.g., by soldering, by adhesives, by wire-bonding, by flip-chip bonding, and the like, to a Z-axis substrate carrier 52 to provide a Z-axis sensor unit 50 having a sensing capability in sensing direction Z. The Z-axis substrate carrier 52 includes a plurality of bonding pads 51b, e.g., external pins, leadless leads, bumping pads, and the like, that is structured and arranged on the face to which the Z-axis sensor die 53 is fixedly attached. Moreover, a plurality of I/O bonding pads 56a is structured and arranged on the face of the Z-axis sensor die 53 that is opposite the sensing direction Z, i.e., in the negative Z-direction. A plurality of leads 51a provides operational communication between the Z-axis sensor die 53 and the plurality of bonding pads 51b.

In still another aspect of the fifth embodiment, the Z-axis sensor unit 50 can be attached, e.g., by soldering, by adhesives, by solder reflow, and the like, to the base substrate 58 via the slotted portions 54. Each I/O pads 56a on the Z-axis sensor unit 50 is structured and arranged to be in registration with a discrete interconnection pads 55b disposed on the base substrate 58 between the slotted portions 54. The Z-axis sensor unit 50 is attached to the base substrate 58 so that the initial sensing direction Z is orthogonal or substantially orthogonal to the plane of the bottom portion 96 of the package 58. Because the Z-axis sensor unit 50 comes with its own I/O pads 56a, bonding wires are not necessary to connect the Z-axis sensor unit 50 to the interconnection pads 55b.

After installation, the Z-axis sensor unit 50 is operationally positioned in a sub-cavity area 59 of the package 58 so that the Z-axis substrate carrier 52 is disposed between the Z-axis sensor unit 50 and the X- and Y-axis sensor die(s) 57. The sub-cavity area 59 provides space for moving parts associated with the Z-axis sensor unit 50.

Although the above description of the fifth embodiment described attaching the X- and Y-axis sensor die(s) 57 to package 58 before attaching the Z-axis sensor unit 50, those skilled in the art will appreciate that, alternatively, the Z-axis sensor unit 50 can be attached to the base substrate 58 prior to attaching the X- and Y-axis sensor die(s) 57 without violating the scope and spirit of this disclosure.

Figure 6A:
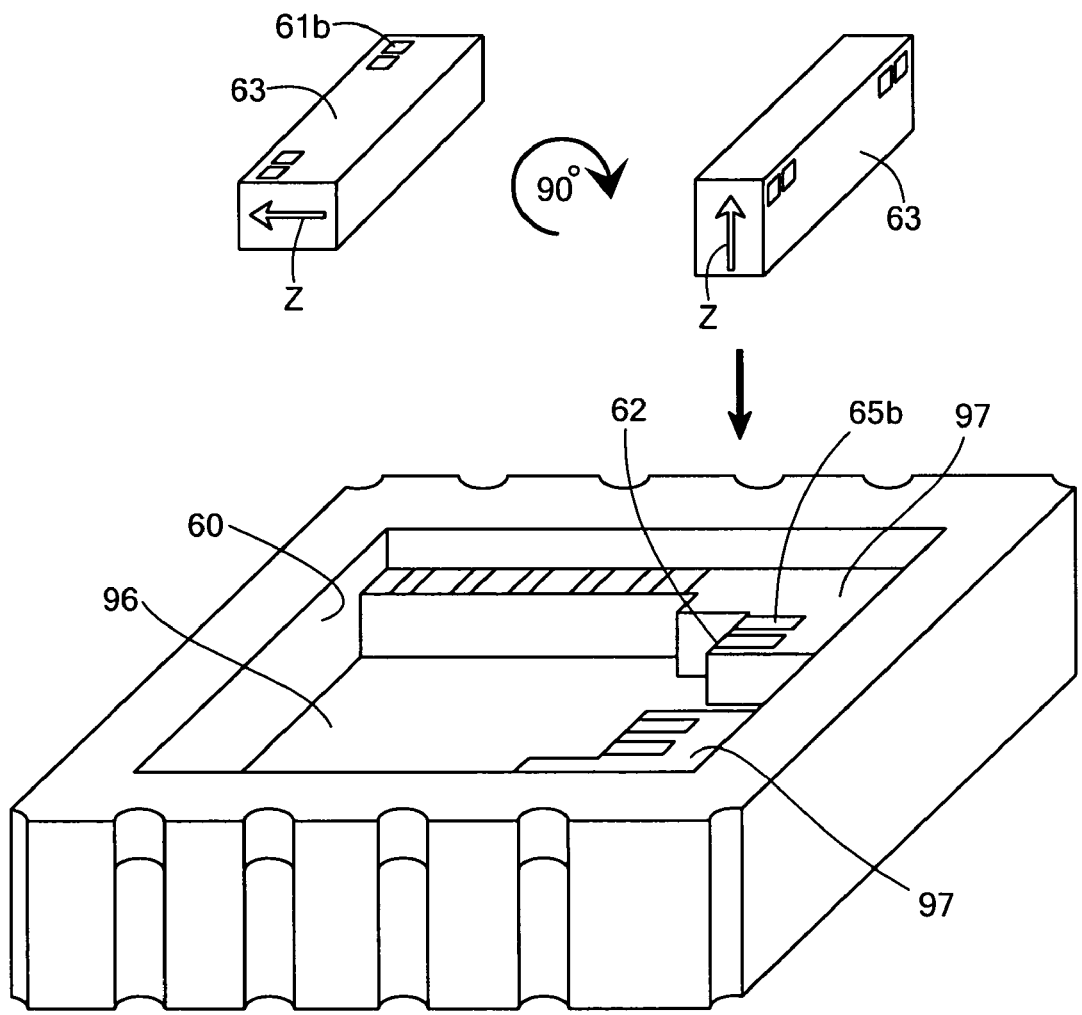
FIGS. 6A and 6B provide an illustrative example of a three-dimensional multi-chip and/or tri-axial sensor in two stages of manufacture in accordance with a sixth embodiment of the present invention.
Figure 6B:
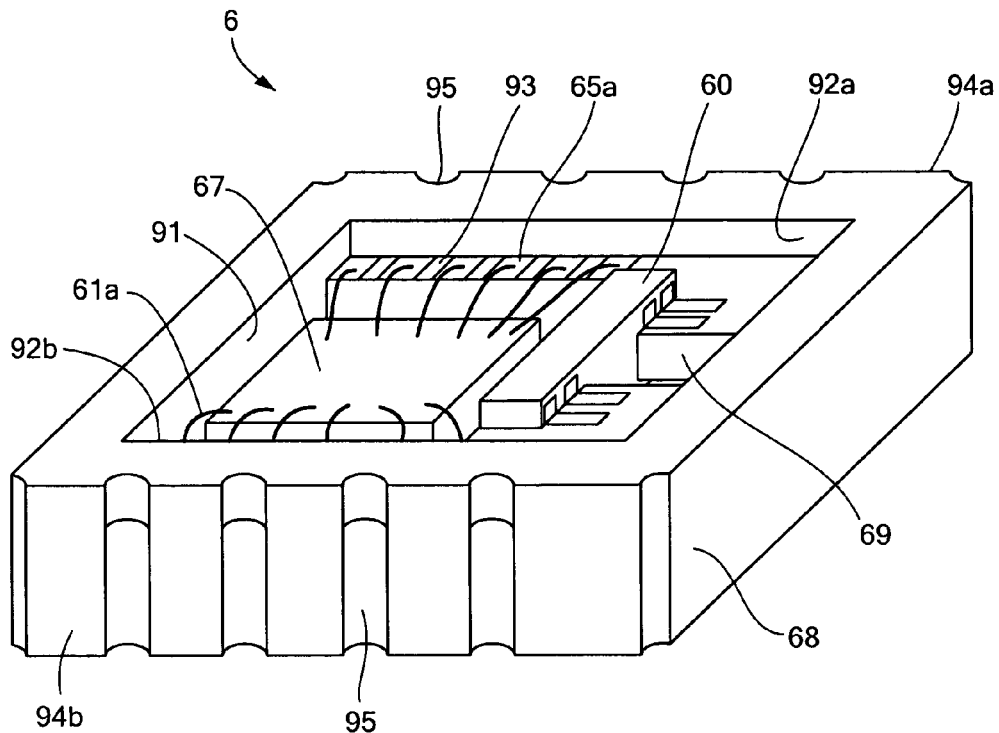

In a slight modification of the fifth embodiment, referring to FIGS. 6A and 6B, there is shown a sixth embodiment of the present invention in two stages of manufacture. Shown is a preformed base substrate, or package, 68, e.g., a ceramic package or a package of some other rigid material. During manufacture, the base substrate 68 is hollowed out and/or is preformed to include a cavity 91. Moreover, a plurality of external I/O interconnections or pads 95 has been disposed on two or more of the exterior side walls 94a and 94b.

In the sixth embodiment, the cavity 91 includes a pair of opposing side walls 92a and 92b, each side wall 92a and 92b having a shelf portion 93, which houses a plurality of internal I/O interconnections or pads 55a, and a side wall shelf 97. The side wall shelf 97 is discontinuous and, moreover, the discontinuous side wall shelf 97 includes a plurality of interconnection pads 65b that are structured and arranged on either side of a Z-sensor substrate cavity 69. The sub-cavity area 69 provides space for moving parts associated with the Z-axis sensor.

In one aspect of the sixth embodiment, one or more X- and Y-axis sensor dies 67 is fixedly and operationally attached, e.g., by soldering, by adhesives, by wire-bonding, by flip-chip bonding, and the like, to the cavity bottom 96 between the shelf portions 93 and the plurality of interconnection pads 65a. Leads 61a provide operational communication between the X- and Y-axis sensor die(s) 67 and the interconnection pads 65a.

Here again, those skilled in the art can appreciate that the integrated circuit (not shown) can be integrally designed with the X- and Y-axis sensor dies 67 or stacked above or below the X- and Y-axis sensor dies 67 or disposed on the same plane as the X- and Y-axis sensor dies 67.

In another aspect of the sixth embodiment, a bumping Z-axis sensor die or a pre-packaged Z-axis sensor unit 63 includes a plurality of bonding pads 61, e.g., external pins, leadless leads, bumping pads, and the like, that is structured and arranged on the long face of the Z-axis sensor unit 63. The bonding pads 61 on the Z-axis sensor 63 are structured and arranged to be in registration with each of the interconnection pads 65b disposed on the base substrate 68.

The Z-axis sensor unit 63 is operationally positioned along the Z-axis sensor die side wall 62 and fixedly attached, e.g., by soldering, by adhesives, by flip-chip bonding, and the like, to the interconnection pads 65b. Because the Z-axis sensor unit 63 has its own bonding pads 61, bonding wires are not necessary to connect the Z-axis sensor unit 63 to the interconnection pads 65b. Furthermore, the Z-axis sensor unit 63 is attached to the base substrate 68 so that the sensing direction Z is orthogonal or substantially orthogonal to the plane of the bottom portion 96 of the package 68.

Although the description of the sixth embodiment described attaching each of the one or more X- and Y-axis sensor dies 67 before attaching the Z-axis sensor unit 63, those skilled in the art will appreciate that, alternatively, the Z-axis sensor unit 63 can be attached to the base substrate 68 prior to attaching the X- and Y-axis sensor die(s) 67 without violating the scope and spirit of this disclosure.

Figure 7:
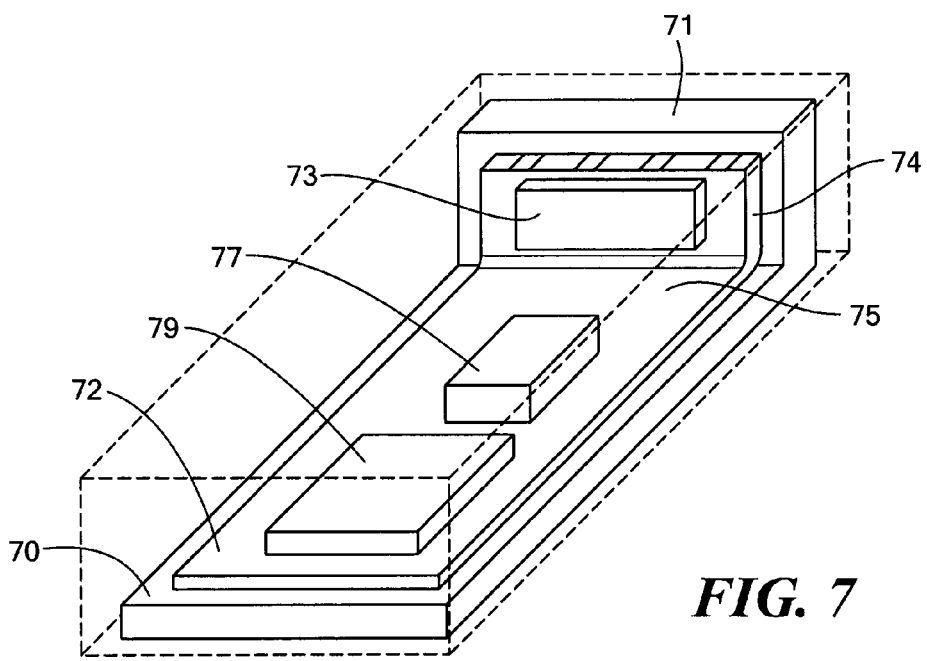
FIG. 7 provides an illustrative example of a three-dimensional multi-chip and/or tri-axial sensor in two stages of manufacture in accordance with a seventh embodiment of the present invention.

Referring to FIG. 7, there is shown a seventh embodiment of the present invention. The seventh embodiment comprises a flexible carrier 72 to which the Z-axis sensor die 73, one or more X- and Y-axis sensor dies 77, and the ASIC 79 are fixedly and operationally attached. The flexible carrier 72 is made of a pliable material, e.g., a printed circuit board (PCB), so that it can be re-configured to provide a vertical of substantially vertical portion 74 at one end. Moreover, the flexible carrier 72 can be fixedly attached to a base substrate 70 that also includes a preformed, vertical of substantially vertical portion 71 at one end, e.g., an L-type substrate.

According to the seventh embodiment, first the Z-axis sensor die 73, the X- and Y-axis sensor die(s) 77, and the ASIC 79 are bonded, e.g., wire-bonded, flip-chip bonded, and the like, or otherwise fixedly attached to the flexible carrier 72. For ease of manufacture, each of the Z-axis sensor die 73, the X- and Y-axis sensor die(s) 77, and the ASIC 79 is bonded to the flexible carrier 72 while the upper surface of the flexible carrier 72 is planar or substantially planar. Furthermore, the Z-axis sensor die 73 is bonded near a distal end of the flexible carrier 72 and the sensing direction Z of the Z-axis sensor die 72 lies in the plane of the flexible carrier 72.

In one aspect of the seventh embodiment, the portion of the flexible carrier 72 nearest the distal end to which the Z-axis sensor die 73 is bonded is re-configured, e.g., bent and rotated about 90 degrees from the horizontal, to provide a vertical of substantially vertical portion 74. For example, the bent portion 74 of the flexible carrier 72 is bent and rotated so that the sensing direction Z of the Z-axis sensor die 72 is now orthogonal or substantially orthogonal to the plane of the flexible carrier 72.

The invention is not to be construed as being limited to just one side bonding. Indeed, the invention can also be practiced with double side bonding for the flexible carrier 72.

The flexible carrier 72 can then be fixedly attached, e.g., by wire bonding, by bump bonding, by adhesive, by soldering, and the like, to the L-type substrate 70. For example, the vertical portion 74 of the flexible carrier 72 can be adhesively attached to the vertical support of L-type substrate 70. Further, after aligning the distal end of the flexible carrier 72 with the top end of L-type substrate 70, I/O pads (not shown) on the flexible carrier 72 can be connected to pads (not shown) in horizontal plane of the L-type substrate 70.

In one aspect of the seventh embodiment, the flexible carrier 72 is attached so that the vertical of substantially vertical portion 74 of the flexible carrier 72 and the Z-axis sensor die 73 attached thereto are supported by the vertical of substantially vertical portion 71 of the L-type substrate 70. The I/O connections and leads (not shown) can be structured and arranged on the bottom of the L-type substrate 70. Alternatively, if the L-type substrate 70 is a leadframe, the I/O connections and leads (not shown) can be structured and arranged by trimming and forming.

Once the flexible carrier 72 and the L-type substrate 70 are physically and operationally connected, the entire device can be encapsulated in a resin molding 75.

Figure 8:
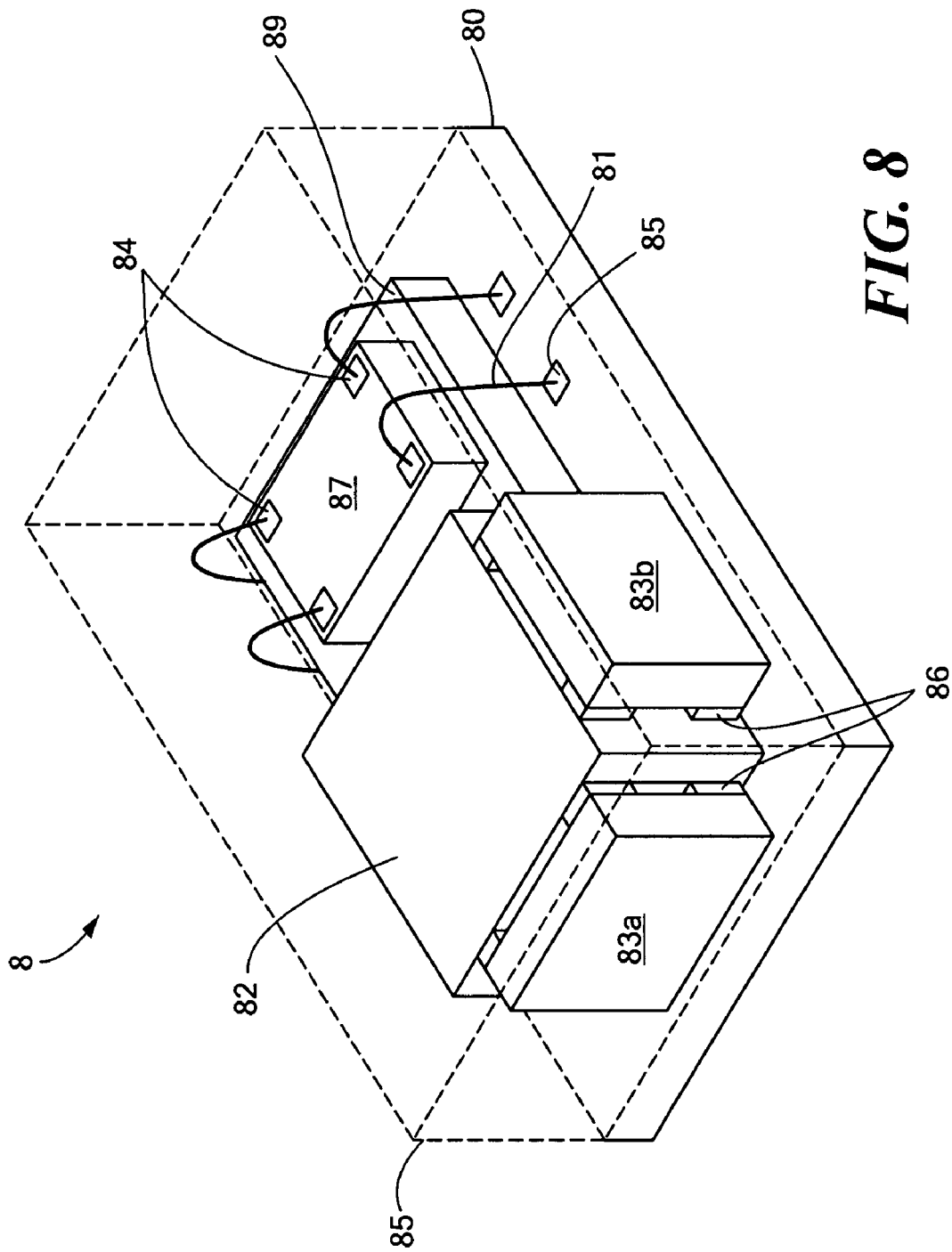
FIG. 8 provides an illustrative example of a three-dimensional multi-chip and/or tri-axial sensor in two stages of manufacture in accordance with an eighth embodiment of the present invention.

Referring to FIG. 8, there is shown an eighth embodiment of the present invention. The eighth embodiment comprises a multi-layered carrier 82 (herein after a "cube carrier"), made of, e.g., ceramic or PCB materials, that is fixedly and operationally attached to a base substrate 80. The cube carrier 82 provides a rigid, multi-layer structure, e.g., PCB, ceramic, pre-molded leadframe, and the like, having a plurality of I/O interconnections or pads 86 on up to six (6) faces of the cube 82.

In one aspect of the eighth embodiment, at least one Z-axis sensor die 83a and 83b can be fixedly attached, e.g., by soldering, by wire-bonding, by adhesive, by flip-chip bonding, and the like, to the cube carrier 82. The cube carrier 82, in turn, can be fixedly attached to the base substrate 80, e.g., through know surface-mounting technology (SMT) reflow soldering, flip-chip bonding, and the like.

The one or more X- and Y-axis sensor dies 87 and ASIC 89 can be fixedly and operationally attached, e.g., by soldering, by wire-bonding, by adhesive, by flip-chip bonding, and the like, to each other and to the base substrate 80. The leads 81 from I/O pads 84 that are structured and arranged on the X- and Y-axis sensor die(s) 87 can be fixedly and operationally attached, e.g., by soldering, by wire-bonding, by flip-chip bonding, by adhesive, and the like, to corresponding I/O pads 85 that are structured and arranged on the substrate 80. For example, the one or more X- and Y-axis sensor dies 87 and ASIC 89 are operationally interconnected, e.g., by soldering, by wire-bonding, by flip-chip bonding, by adhesive, and the like, through a plurality of interconnections (not shown) that are structured and arranged on each of the X- and Y-axis sensor die(s) 87 and ASIC 89 and the ASIC 89 and the base substrate 80 are operationally connected, e.g., by soldering, by wire-bonding, by flip-chip bonding, by adhesive, and the like, through a plurality of interconnections (not shown) that are structured and arranged on each of the ASIC 89 and the base substrate 80.

In another aspect of the eighth embodiment, once all of the components have been fixedly attached to the base substrate 80, the device above the base substrate 80 can be encapsulated to provide a molding 8.

For all embodiments, when flip-chip bonding is used, underfilling beneath the Z-axis sensor die, the X- and Y-axis sensor die(s), and ASIC to encapsulate the bonding areas may be required. Likewise, when wire-bonding is used, pre-encapsulation of the Z-axis sensor die, the X- and Y-axis sensor die(s) may also be required.

While the invention is described through the above-described exemplary embodiments, it will be understood by those of ordinary skill in the art that modifications to, and variations of, the illustrated embodiments may be made without departing from the inventive concepts disclosed herein. Accordingly, the invention should not be viewed as limited, except by the scope and spirit of the appended claims.

What is claimed is:

1. A method of manufacturing a device for providing tri-axial measurements in an x-direction, a y-direction, and a z-direction, the method comprising the steps of:

providing a leadframe, a plurality of input/output leads, and a plurality of z-axis sensor leads;

attaching at least one X- and Y-axis sensor die, having orthogonal sensing directions, and at least one integrated circuit to be in at least one of physical communication and operational communication with the leadframe, the plurality of input/output leads, and the plurality of z-axis sensor leads;

attaching a z-axis sensor die, having a sensing direction, to at least two of the plurality of input/output leads and to at least two of the plurality of Z-axis sensor leads so that the sensing direction of said Z-axis sensor die is in the same or substantially the same plane as the orthogonal sensing directions of the at least one X- and Y-axis sensor die;

pre-encapsulating the Z-axis sensor die, some portion of the plurality of input/output leads, and some portion of the plurality of Z-axis sensor leads; and re-positioning the pre-encapsulated Z-axis sensor die so that its sensing direction is orthogonal or substantially orthogonal to the orthogonal sensing directions of the at least one X- and Y-axis sensor die; and encapsulating the leadframe, the plurality of input/output leads, the plurality of Z-axis sensor leads, the at least one X- and Y-axis sensor die, the at least one integrated circuit, and the pre-encapsulated Z-axis sensor die in a final molding.

2. The method as recited in claim 1, wherein the step of providing a leadframe comprises providing a leadframe that is structured and arranged with a vertical or substantially vertical portion.

3. The method as recited in claim 2, wherein the Z-axis sensor die is attached to the substantially vertical portion of the leadframe.

4. The method as recited in claim 3, wherein the Z-axis sensor die is attached to the substantially vertical portion by soldering, wire-bonding, flip-chip bonding or adhesively.

5. The method as recited in claim 1, wherein the step of providing a leadframe comprises providing a leadframe having a paddle portion and a plurality of leadframe legs.

6. The method as recited in claim 5, wherein the Z-axis sensor die is attached to the plurality of leadframe legs and the plurality of Z-axis sensor leads.

7. The method as recited in claim 3, wherein the Z-axis sensor die is attached to the substantially vertical portion by soldering, wire-bonding, flip-chip bonding or adhesively.

8. The method as recited in claim 1, wherein the step of attaching at least one X- and Y-axis sensor die and at least one integrated circuit includes attaching said at least one X- and Y-axis sensor die and said at least one integrated circuit to the leadframe, the plurality of input/output leads, and the plurality of Z-axis sensor leads by one or more of soldering, wire-bonding, flip-chip bonding and adhesively.

9. The method as recited in claim 1, wherein the method further comprises pre-encapsulating the Z-axis sensor die, some portion of the plurality of input/output leads, and some portion of the plurality of Z-axis sensor leads or pre-encapsulating the leadframe, some portion of said plurality of input/output leads, some portion of said plurality of Z-axis sensor leads, the at least one X- and Y-axis sensor die, and the at least one integrated circuit in a pre-molding prior to the encapsulating step.

10. The method as recited in claim 1, wherein the pre-encapsulated Z-axis sensor die is re-positioned by bending said pre-encapsulated Z-axis sensor die, said plurality of input/output leads, and said plurality of Z-axis sensor leads approximately 90 degrees from horizontal.

* * * * *